(12) United States Patent
Liaw

(10) Patent No.: US 12,317,549 B2
(45) Date of Patent: May 27, 2025

(54) DIELECTRIC FIN STRUCTURES WITH VARYING HEIGHT

(71) Applicant: Taiwan Semiconductor Manufacturing Company, Ltd., Hsinchu (TW)

(72) Inventor: Jhon Jhy Liaw, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 472 days.

(21) Appl. No.: 17/384,092

(22) Filed: Jul. 23, 2021

(65) Prior Publication Data

US 2023/0029354 A1    Jan. 26, 2023

(51) Int. Cl.
*H01L 21/762* (2006.01)
*H01L 21/02* (2006.01)
*H10D 30/01* (2025.01)
*H10D 30/67* (2025.01)
*H10D 62/10* (2025.01)

(52) U.S. Cl.
CPC ....... *H10D 62/115* (2025.01); *H01L 21/0259* (2013.01); *H01L 21/76229* (2013.01); *H10D 30/031* (2025.01); *H10D 30/6735* (2025.01); *H10D 30/6757* (2025.01); *H10D 62/118* (2025.01)

(58) Field of Classification Search
CPC ............... H01L 21/76; H01L 21/76224; H01L 29/0649
See application file for complete search history.

(56) References Cited

U.S. PATENT DOCUMENTS

| | | | |
|---|---|---|---|
| 8,586,449 B1* | 11/2013 | Chang | H01L 21/845 438/432 |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,576,814 B2 | 2/2017 | Wu et al. | |
| 9,548,303 B2 | 7/2017 | Lee et al. | |
| 2013/0285116 A1 | 10/2013 | Lochtefeld et al. | |
| 2019/0006345 A1* | 1/2019 | Wang | H01L 21/32139 |
| 2020/0043935 A1* | 2/2020 | Liaw | H10B 10/12 |
| 2020/0091311 A1* | 3/2020 | Hsu | H01L 21/823431 |
| 2020/0126798 A1* | 4/2020 | Lin | H01L 21/28518 |
| 2020/0135580 A1* | 4/2020 | Hsieh | H01L 27/0886 |

* cited by examiner

*Primary Examiner* — Matthew C Landau
*Assistant Examiner* — Halee Cramer
(74) *Attorney, Agent, or Firm* — Cooper Legal Group, LLC

(57) ABSTRACT

A semiconductor device includes a semiconductor fin structure extending in a first direction on a substrate and a first dielectric fin structure extending parallel to the fin structure, the first dielectric fin structure being underneath a gate structure extending in a second direction that is perpendicular to the first direction. The device further includes a second dielectric fin structure extending parallel to the fin structure, the second dielectric feature being positioned beneath a gate cut feature. A top surface of the first dielectric fin structure is higher than a top surface of the second dielectric fin structure.

20 Claims, 9 Drawing Sheets

DIELECTRIC FIN STRUCTURES WITH VARYING HEIGHT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
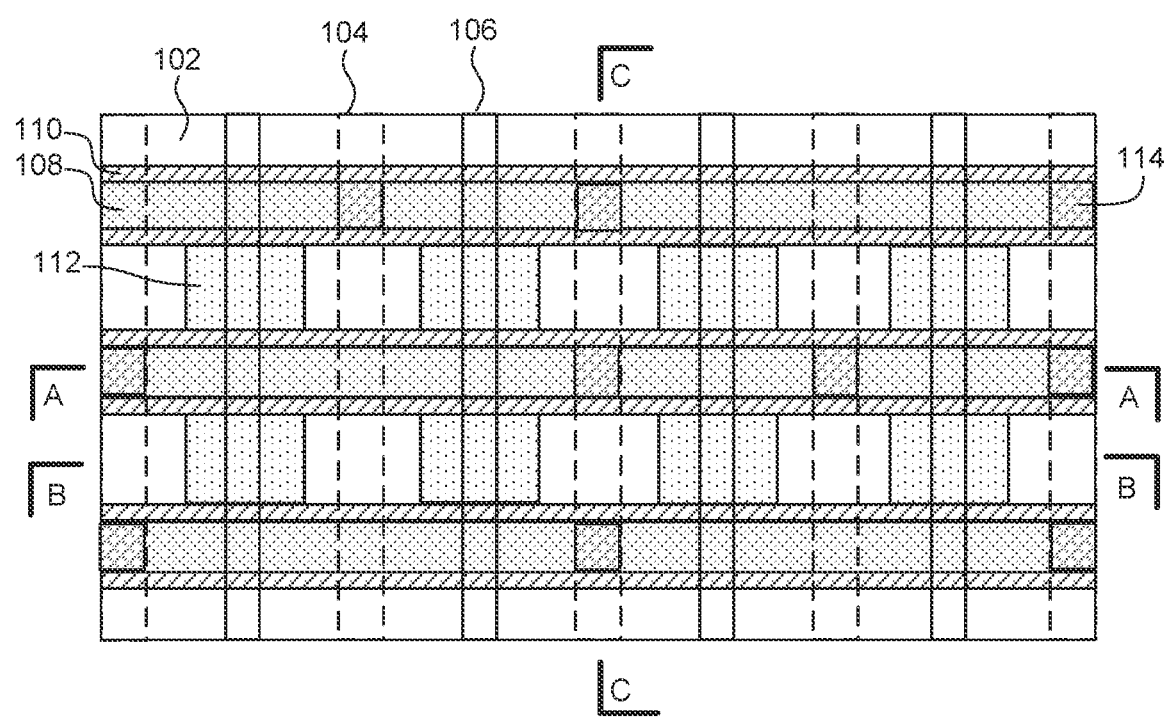
FIG. 1 is a top view of dielectric fin structures with varying height, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

Semiconductor structures often involve semiconductor fin structures that act as channels for transistor devices. As the industry moves towards smaller chips and smaller dimensions, the pitch between adjacent fin structures becomes smaller. This complicates the manufacturing process. To improve the manufacturing process, dummy dielectric lines may be placed between real semiconductor fin structures. This provides a uniform environment in the topography, which improves the manufacturing process for higher layers.

According to principles described herein, the dielectric fin structures may have lower heights at regions where gate cut features are formed. In particular, gate structures may be formed perpendicular to the semiconductor fin structures and the dielectric fin structures. To cut the gate structures, a patterning process is used to remove a portion of the gate structure. This patterning process leaves an opening that is then filled with a gate end dielectric material. Before the opening is filled, an etching process may partially remove the exposed top surface of the dielectric fin structure. Thus, this portion of the fin structure underneath the gate dielectric is lower than other parts of the dielectric fin structure.

FIG. 1 is a top view of dielectric fin structures with varying height. According to the present example, the top view shows a plurality of semiconductor fin structures 106 within a Shallow Trench Isolation (STI) region 102. Between the real semiconductor fin structures 106 are dummy dielectric fin structures 104. The dummy dielectric structures 104 are illustrated with dotted lines to help visually distinguish them from the real semiconductor fin structures 106. FIG. 1 also illustrates gate structures 108 extending perpendicular to the semiconductor fin structures and the dielectric fin structures. The gate structures may also be cut by gate-cut dielectric structures 114. Between the gate structures are source/drain structures 112. These may be epitaxially grown source/drain structures.

The gate structures 108, semiconductor fin structures 106, and source/drain regions 112 form transistor devices. The transistor devices may form an IC, or a portion thereof, that may comprise static random access memory (SRAM) and/or standard logic circuits, passive components such as resistors, capacitors, and inductors, and active components such as p-type field effect transistors (PFETs), n-type FETs (NFETs), multi-gate FETs such as FinFETs and gate all-around (GAA) FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof. The gate structures 108, semiconductor fin structures 106, and source/drain regions 112 will be discussed in more detail below.

In one example, the semiconductor fin structures 106 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one example, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fin structures 106 by etching initial epitaxial semiconductor layers of the substrate. The etching process can include dry etching, wet etching, reactive ion etching (RIE), and/or other suitable processes. The semiconductor fin structures 106 may be doped with proper dopants based on whether they are for n-type or p-type transistors.

The isolation structure 102 may include silicon oxide, silicon nitride, silicon oxynitride, fluoride-doped silicate glass (FSG), a low-k dielectric material, and/or other suitable insulating material. The isolation structure 102 may be shallow trench isolation (STI) features. In an example, the isolation structure 102 is formed by etching trenches in the substrate as part of the semiconductor fin 106 formation process. The trenches may then be filled with isolating material, followed by a chemical mechanical planarization (CMP) process and/or an etch-back process. The isolation structure 102 may include a multi-layer structure, for example, having one or more thermal oxide liner layers. Then, an STI region 102 may be deposited over the patterned fin structures. The STI region may then be recessed to the desired height, thus exposing the top portions of the fin structures.

The dielectric fin structures 104 extend parallel with the semiconductor fin structures 106. The dielectric fin structures may be inserted between active semiconductor fins 106 for improving fin density uniformity and for isolating adjacent semiconductor fins 106 and adjacent gate structures. In some examples, the dielectric fin structures 104 may include multiple dielectric layers. The dielectric fins 104 help reduce coupling capacitance between adjacent gate structures. The dielectric fins 104 also provide high etch resistivity during etching processes, thereby providing high dummy fins for isolating nearby source/drain epitaxial features. Due to the presence of the dielectric fins 104, the source/drain epitaxial features can be grown to maximum or near-maximum volume, which increases strain to the channel and increases source/drain contact landing area for reduced source/drain contact resistance. The dielectric fin structures may have a width within a range of 5-500 nanometers. The dielectric fin structures 104 may be selected from a group consisting of SiO2, SiOC, SiOCN, SiCN, carbon content oxide, nitrogen content oxide, or combination. In some examples, the dielectric fin structures may be selected from a nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or combination.

The gate structures 108 may include multiple layers, such as a gate dielectric layer and a gate structure layer. The gate dielectric layer may include silicon oxide ($SiO_2$), silicon oxynitride (SiON), aluminum silicon oxide (AlSiO), a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer may be deposited by chemical oxidation, thermal oxidation, atomic layer deposition (ALD), or other suitable methods. The gate structure layer may include a work function metal layer, a metal fill layer, and other suitable layers such as barrier layer(s) and capping layer(s). The work function metal layer may be a p-type or an n-type work function layer for the p-type FinFETs and n-type FinFETs, respectively. The p-type work function layer comprises a metal such as titanium nitride (TiN), tantalum nitride (TaN), ruthenium (Ru), molybdenum (Mo), tungsten (W), platinum (Pt), or combinations thereof. The n-type work function layer comprises a metal such as titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, physical vapor deposition (PVD), and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes.

The gate structure may include spacers 110 on both sides. The gate spacers 110 may include one or more dielectric layers having silicon nitride ($Si_3N_4$), silicon oxide ($SiO_2$), silicon carbide (SiC), silicon carbide nitride (SiCN), silicon oxynitride (SiON), silicon oxycarbide (SiOC), silicon oxycarbide nitride (SiOCN), a low-k dielectric material, other materials, or a combination thereof. The gate spacers 110 may be formed by one or more methods including chemical oxidation, thermal oxidation, ALD, CVD, and/or other suitable methods.

The source/drain features 112 may include epitaxially grown semiconductor material(s) such as epitaxially grown silicon for n-type FinFETs, and may additionally include one or more n-type dopants, such as phosphorus or arsenic. The source/drain features 112 may also include epitaxially grown semiconductor material(s) such as epitaxially grown silicon germanium for p-type FinFETs, and may additionally include one or more p-type dopants, such as boron or indium. The source/drain features 112 may be formed by a low-pressure CVD (LPCVD) process with a silicon-based precursor, a selective epitaxial growth (SEG) process, a cyclic deposition and etching (CDE) process, or other epitaxial growth processes. The source/drain features 112 may be doped based on the type of transistor to be formed (NMOS or PMOS).

Figure 2A:
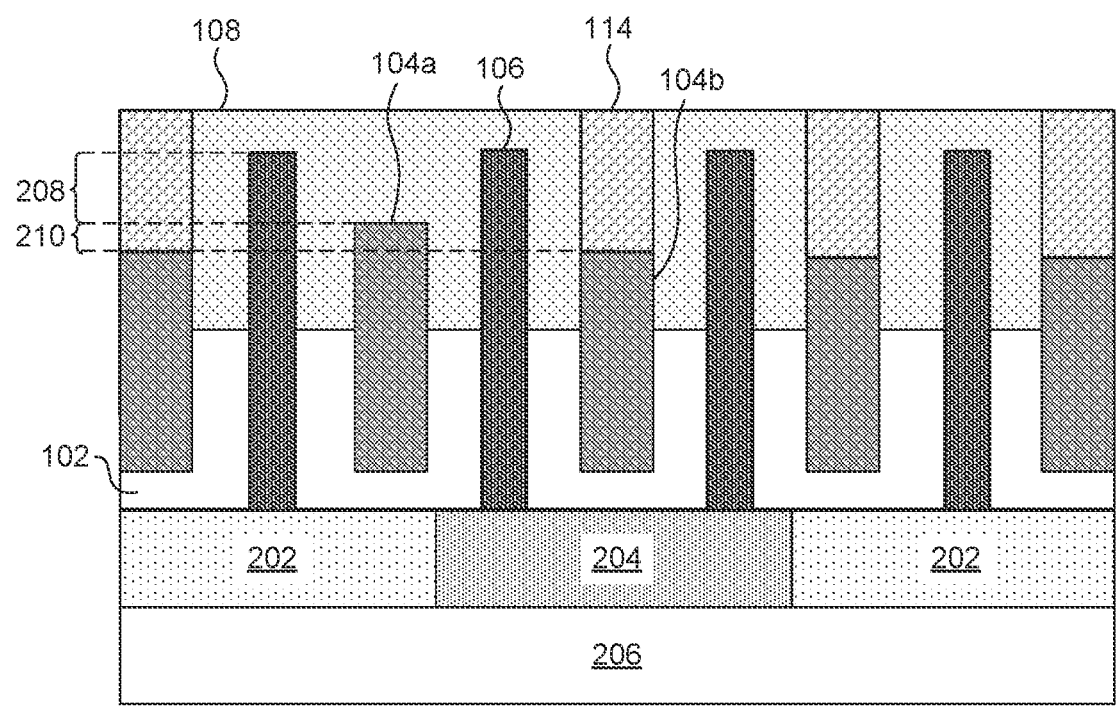
FIGS. 2A and 2B is a cross-sectional view of dielectric fin structures with varying height taken along a gate structure, according to one example of principles described herein.

FIG. 2A is a cross-sectional view of dielectric fin structures with varying height taken along a gate structure. FIG. 2A corresponds to cut A-A of FIG. 1. FIG. 2A illustrates a semiconductor substrate 206. The semiconductor substrate 206 may be a silicon substrate. The semiconductor substrate may be part of a silicon wafer. Other semiconductor materials are contemplated. The substrate 206 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 206 may be a single-layer material having a uniform composition. Alternatively, the substrate 206 may include multiple material layers having similar or different compositions suitable for IC device manufacturing. In one example, the substrate 206 may be a silicon-on-insulator (SOI) substrate having a silicon layer formed on a silicon oxide layer. In another example, the substrate 206 may include a conductive layer, a semiconductor layer, a dielectric layer, other layers, or combinations thereof.

FIG. 2A also illustrates doped wells 202, 204. Doped wells 202 are of P-conductivity type (e.g., doped with p-type impurities such as boron), and are suitable for forming NMOSFETs (e.g., n-type FinFETs). Thus, the transistors formed with the semiconductor fin structures 106 above the p-well may be n-type transistors. Doped well 204 is of N-conductivity type (e.g., doped with n-type impurities such as phosphorous), and is suitable for forming PMOSFETs (e.g., p-type FinFETs). Thus, the transistors formed with the semiconductor fin structures 106 above the n-well may be p-type transistors.

It can be seen in the cross-sectional view of FIG. 2A that there are two types of dielectric fin structures 104. The first type of dielectric fin structure 104a is positioned beneath a gate structure 108. The second type of dielectric fin structure 104b is positioned beneath a gate cut feature 114. While the gate cut feature 114 and the dielectric fin structure 104b are shown with similar widths in FIG. 2A, in some cases the gate cut features 114 may be wider than the dielectric fin structures 104. In some examples, the gate cut features 114 may be narrower than the dielectric fin structures 104.

In the present example, the first type dielectric fin structure 104a has a top surface that is higher than the top surface of the second type dielectric fin structure 104b. The height difference 210 may be within a range of about 5-30 nanometers. Additionally, the top surface of the semiconductor fin structure 106 may be higher than the top surface of the first-type dielectric fin structure 104a. This height difference 208 may be within a range of about 3-20 nanometers.

Figure 2B:
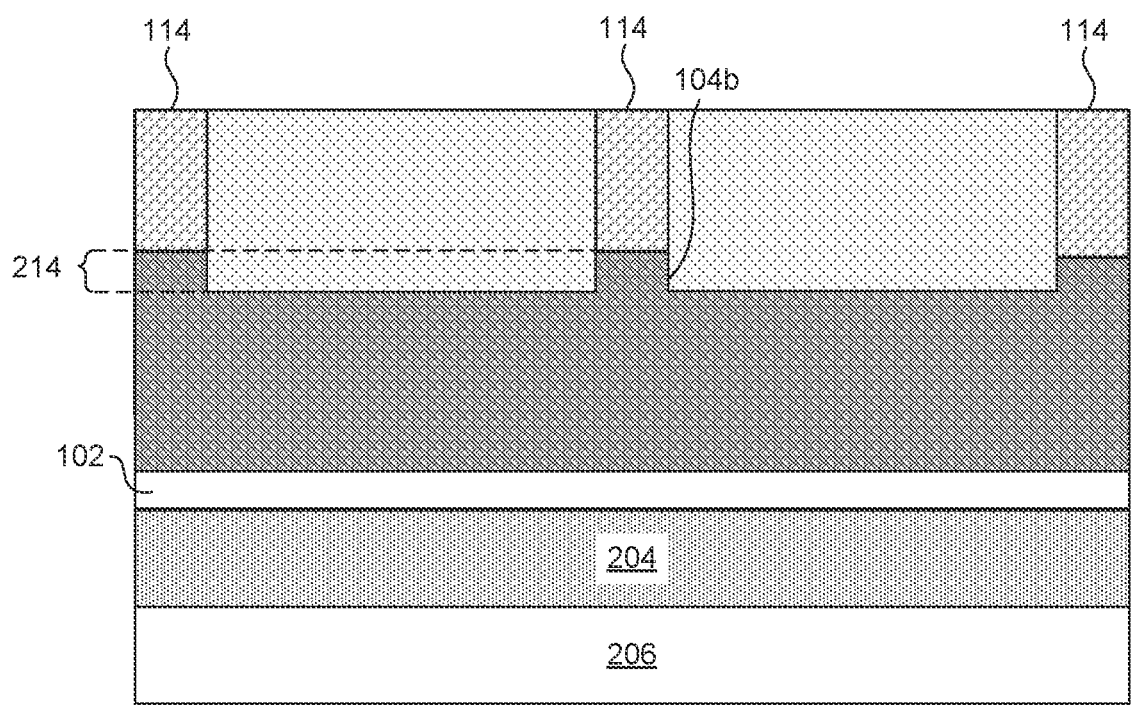

FIG. 2B illustrates a cross-sectional view along the dielectric fin structure under the gate electrode. The cross-section corresponds to cut C-C in FIG. 1. As can be seen, in the space between source/drain regions, the dielectric fin structure has a top surface that is lower than the portion where there are gate cut features 114. The height difference 214 may be within a range of about 3-50 nanometers.

Figure 3:
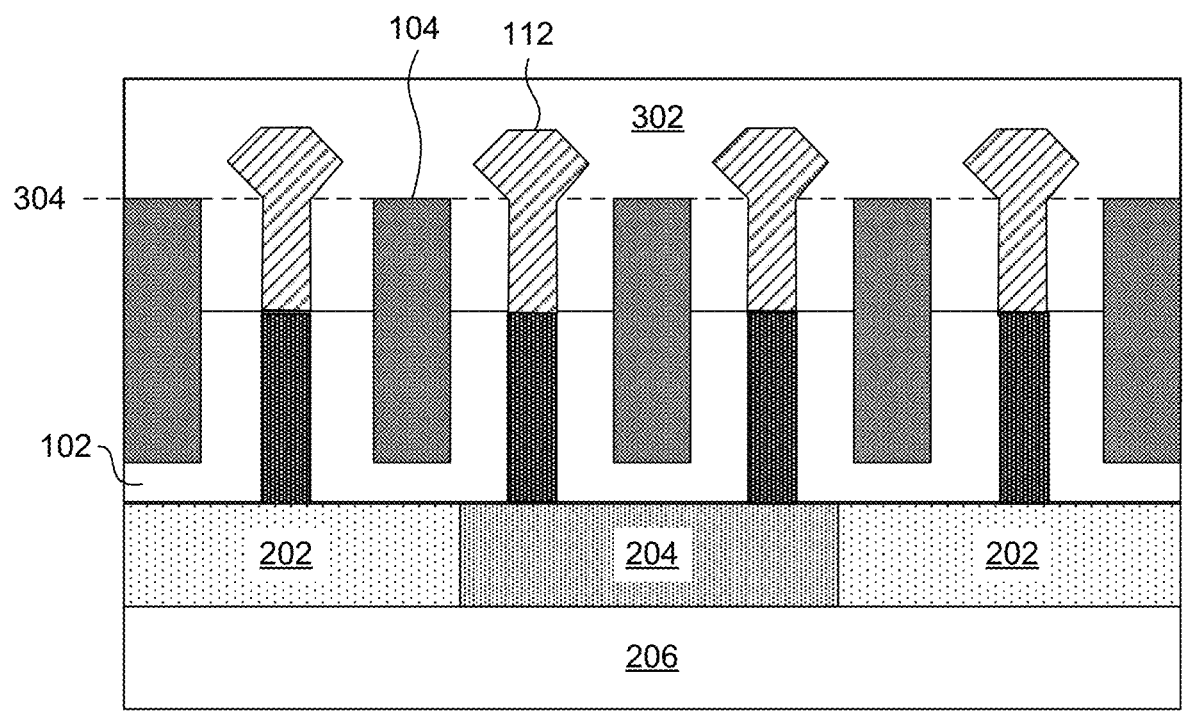
FIG. 3 is a cross-sectional view of dielectric fin structures with varying height taken along source/drain regions, according to one example of principles described herein.

FIG. 3 is a cross-sectional view of dielectric fin structures with varying height taken along source/drain regions FIG. 3 corresponds to cut B-B of FIG. 1. As can be seen, each of the dielectric fin structures 104 has a similar height 304 along this cross-section. The source/drain features 112 may be formed by partially removing portions of the semiconductor fin structures 106 and then replacing those removed portions with an epitaxially grown doped source/drain region. In some examples, an Interlayer Dielectric (ILD) layer 302 may be formed over the source/drain regions 112 and dielectric fin structures 104.

Figure 4:
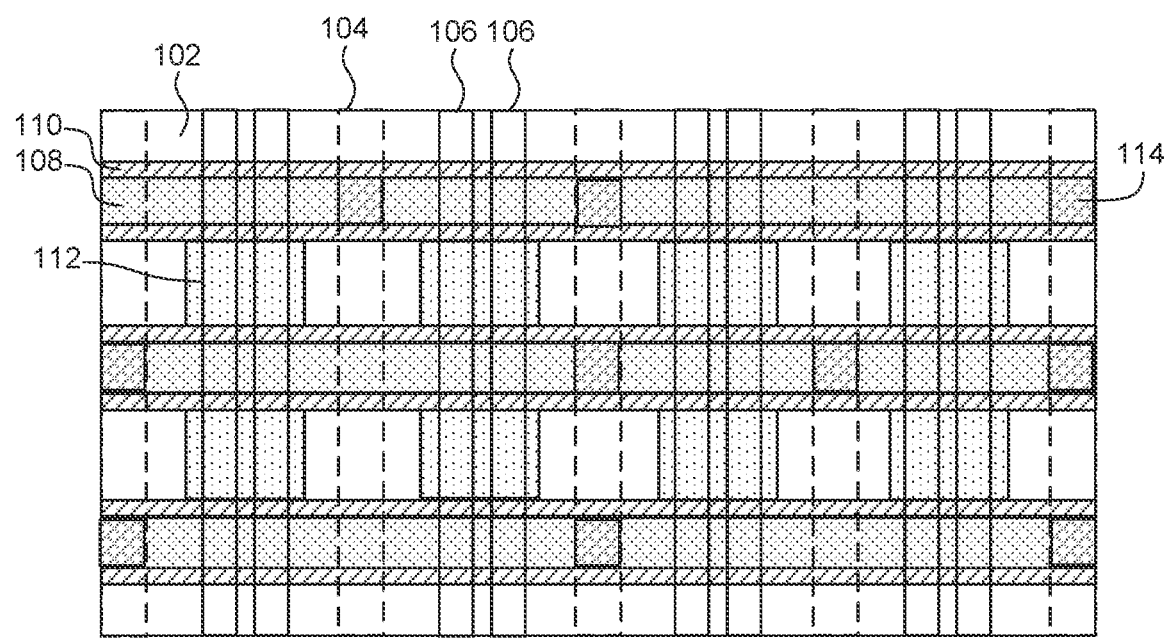
FIG. 4 is a top view of dielectric fin structures with varying height in which multiple semiconductor fin structures are placed between dielectric fin structures, according to one example of principles described herein.

FIG. 4 is a top view of dielectric fin structures with varying height in which multiple semiconductor fin structures are placed between dielectric fin structures. In other words, while the example in FIG. 1 has only a single semiconductor fin structure positioned between each neighboring pair of dielectric fin structures, the example of FIG. 4 includes more than one (in this case two) semiconductor fin structures 106 between neighboring pairs of dielectric fin structures 104.

Figure 5:
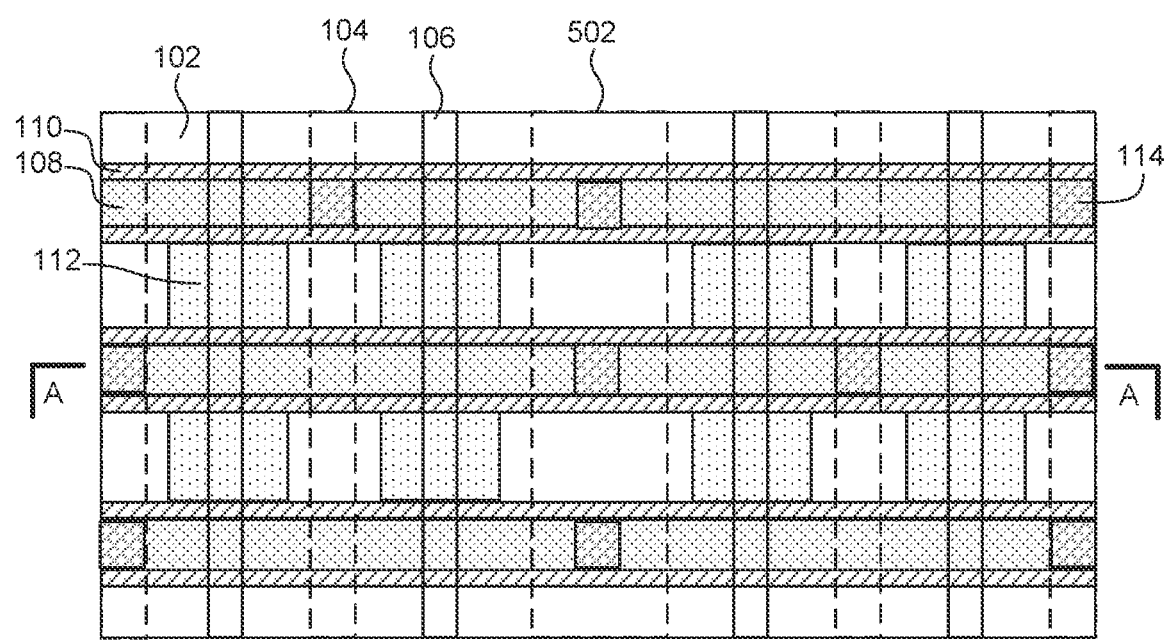
FIG. 5 is a top view of dielectric fin structures with varying height in which some dielectric fin structures are wider than others, according to one example of principles described herein.

FIG. 5 is a top view of dielectric fin structures with varying height in which some dielectric fin structures are wider than others. In the present example, there are two types of dielectric fin structures. The first type of dielectric fin structures 104 are similar to those described in the example of FIG. 1. The second type of dielectric fin structures 502 are wider than the first type of dielectric fin structures.

Figure 6:
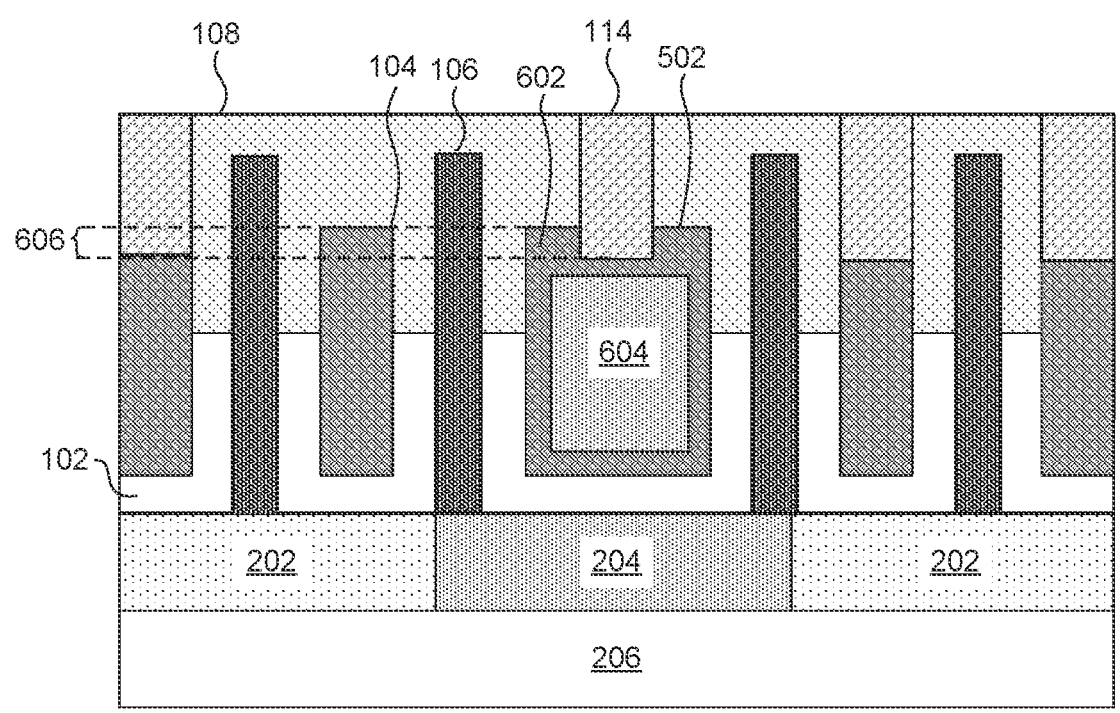
FIG. 6 is a cross-sectional view of dielectric fin structures with varying height and varying widths taken along a gate structure, according to one example of principles described herein.

FIG. 6 is a cross-sectional view of dielectric fin structures with varying height and varying widths taken along a gate structure. FIG. 6 illustrates a cross-sectional view along cut A-A of FIG. 5. As can be seen the second type dielectric fin structure 502 includes two dielectric layers 602, 604. The first dielectric layer 602 may surround the second layer 604. To form the second-type dielectric line, a trench may be patterned into the STI layer 102 before it is recessed to expose the semiconductor fin structures 106. Then, the first layer 602 may be conformally deposited along the bottom and sidewalls of that trench. The second layer 604 may then be used to fill the trench. Then, the first layer material 602 may be deposited on top of the second layer 604.

The gate cut feature 114 may be formed by using a patterning process to form an opening in the gate structure 108. This opening effectively cuts the gate structure. This opening may be formed using an etching process that partially etches through the first layer 602 of the second type dielectric line 502. The opening can then be filled with a dielectric material that electrically isolates the separated portions of the gate structure 108. In one example, the distance 606 between the bottom of the gate cut feature 114 and the top of the dielectric line 502 is within a range of about 5-30 nanometers.

Figure 7:
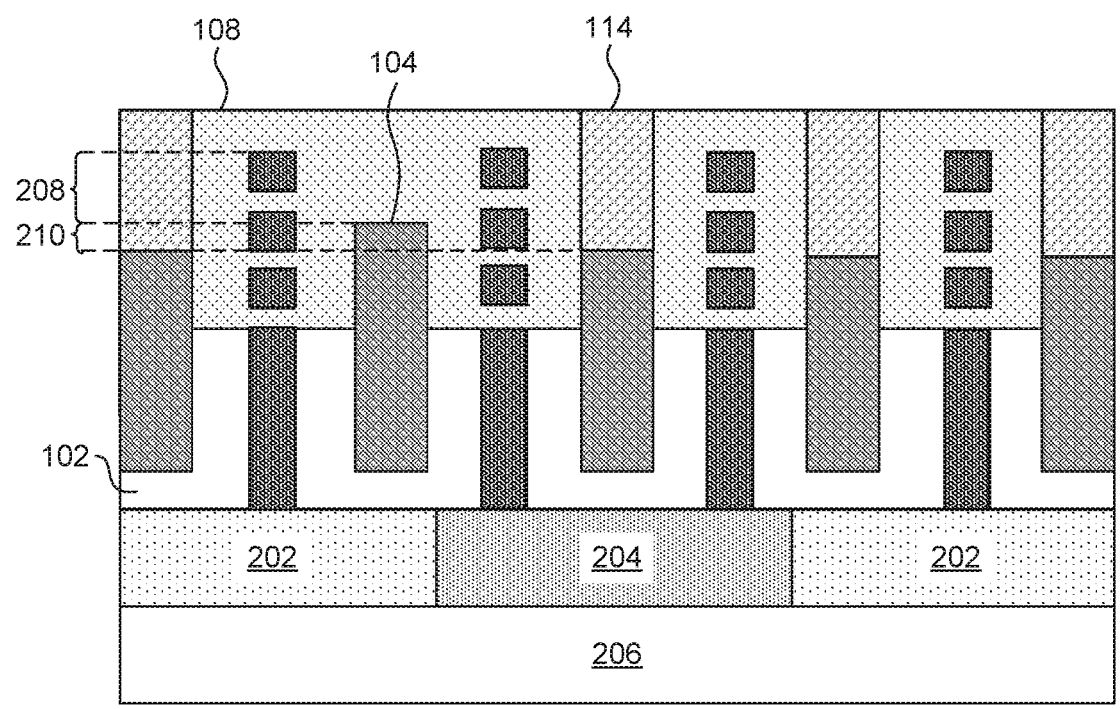
FIG. 7 is a cross-sectional view of dielectric fin structures with varying height, and gate all-around fin structures, taken along a gate structure, according to one example of principles described herein.

FIG. 7 is a cross-sectional view of dielectric fin structures with varying height, and gate all-around fin structures, taken along a gate structure. The example of FIG. 7 is similar to that of FIGS. 1-3, but the semiconductor fin structures are fabricated as gate-all-around (GAA) fin structures. In some examples, to form a GAA device, a semiconductor fin may include a total of three to ten alternating layers of semiconductor materials. For example, the first semiconductor material may be silicon, and the second semiconductor material may be silicon germanium. Either of the first and the second semiconductor materials (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

Alternating layers of the semiconductor materials are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

In a GAA device, a channel stack is formed by depositing alternating layers of semiconductor material that may be selectively etched. For example, a first type of semiconductor material may be epitaxially grown on a substrate. Then, a second type of semiconductor material may be epitaxially grown on that first layer. The process continues by forming alternating layers of the first and second semiconductor material. Then, the channel stacks may be patterned into fin structures. Each fin may thus be a fin stack of alternating semiconductor layers. Then, an etching process (e.g., a wet etching process) can be used to remove the second semiconductor material while leaving the first semiconductor material substantially intact. The remaining second semiconductor material may thus form a stack of nanowires or nanosheets extending between two active regions. A gate device can then be formed to completely surround each of the nanowires or nanosheets. On each side of the gate device is a source or drain region.

A lateral etching process to partially remove the sacrificial semiconductor layers where the inner spacers 108 are to be formed. The lateral etching process may be, for example, a wet etching process. The etching process may be designed to be selective so as to remove the sacrificial semiconductor layer without substantially affecting the semiconductor layer. For example, in the case where the sacrificial semiconductor layer is silicon germanium and the semiconductor layer is silicon, then the etching process may be configured to remove silicon germanium without substantially affecting silicon.

Then, a deposition process is applied to form the inner spacers. Specifically, the inner spacer layer is formed by a conformal deposition process so that the inner spacer layer is formed along sidewalls of the recesses where the source or drain structures are to be formed. The inner spacer layer may be a dielectric material such as SiCN, SiOCN, or SiON.

An etch back process may then be used to remove portions of the inner spacer layer and to expose the channel layers. The etch back process also removes the inner spacer layer from the floor of the recesses and the top of the workpiece. The remaining portions of the inner spacer layers serve to electrically isolate the portions of the gate structure with the source and drain regions to be formed. In some examples, the remaining inner spacer layer may vary within a range of width between about 4-15 nanometers.

A wet etching process may then be used to remove the sacrificial layers between the nanostructures. The wet etching process may use an acid-based etchant such as: sulfuric acid (H2SO4), perchloric acid (HClO4), hydroiodic acid (HI), hydrobromic acid (HBr), nitric acide (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH). By removing the sacrificial semiconductor layers, the channel layers thus become nanostructures extending between source and drain structures.

After the dummy gate structure is removed, a real gate structure is formed. Formation of the real gate device may include a number of steps. For example, a high-k dielectric layer may be deposited so as to surround the channel layers 106. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, depending on the type of transistor device being formed, a work function layer may be deposited. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). Then, a gate layer is deposited. The gate layer may be a conductive material such as a metal material. In this manner, the gate layer entirely surrounds each of the channel layers.

Figure 8:
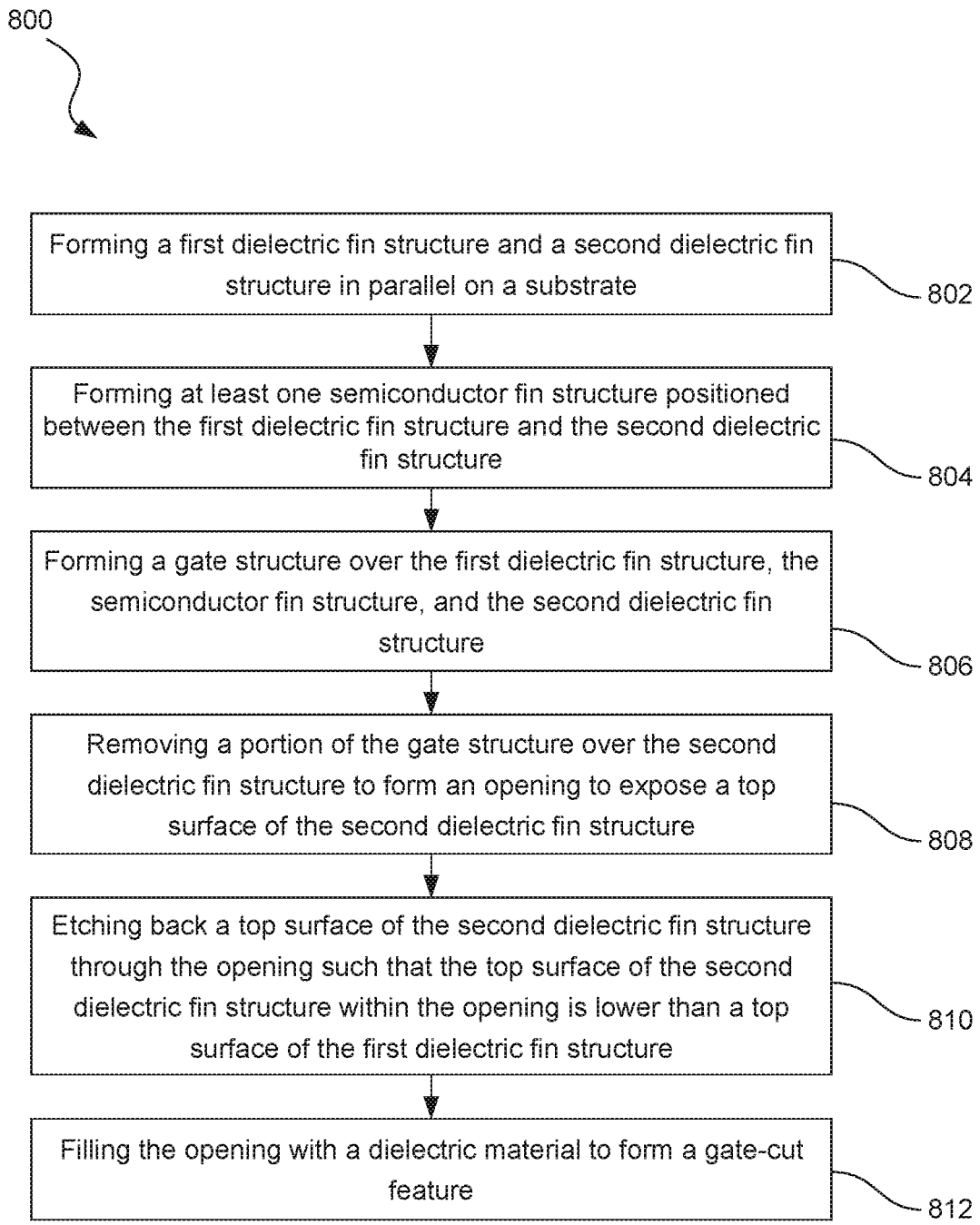
FIG. 8 is a flowchart showing an illustrative method for forming dielectric fin structures with varying height, according to one example of principles described herein.

FIG. 8 is a flowchart showing an illustrative method for forming dielectric fin structures with varying height. According to the present examples, the method includes a process 802 for forming a first dielectric fin structure and a second dielectric fin structure (e.g., 104) in parallel on a substrate. The method 800 further includes a process 804 for forming at least one semiconductor fin structure (e.g., 106) positioned between the first dielectric fin structure and the second dielectric fin structure.

In one example, the semiconductor structure is formed before the dielectric fin structures. Specifically, the semiconductor fin structures may be formed and then covered with a dielectric material such as an STI material. Before recessing the STI material to expose the upper portions of the fin structures, the STI material may be patterned to form trenches. Those trenches may then be filled with the material to form the dielectric fin structures. This dielectric material may be selectively etchable from the STI material. In this manner, the etching may recess the STI structure without substantially affecting the dielectric fin structures.

The semiconductor fin structures may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one example, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fin structures 106 by etching initial epitaxial semiconductor layers of the substrate. The etching process can include dry etching, wet etching, reactive ion etching (RIE), and/or other suitable processes. The semiconductor fins may be doped with proper dopants based on whether they are for n-type or p-type transistors.

Dielectric fin structures may extend parallel with the semiconductor fin structures. The dielectric fin structures may be inserted between active semiconductor fins for improving fin density uniformity and for isolating adjacent semiconductor fins 106 and adjacent gate structures. In some examples, the dielectric fins may include multiple dielectric layers. The dielectric fins help reduce coupling capacitance between adjacent gate structures. The dielectric fins also provide high etch resistivity during etching processes, thereby providing high dummy fins for isolating nearby source/drain epitaxial features. Due to the presence of the dielectric fins, the source/drain epitaxial features can be grown to maximum or near-maximum volume, which increases strain to the channel and increases source/drain contact landing area for reduced source/drain contact resistance. The dielectric fin structures may have a width within a range of 5-500 nanometers. The dielectric fin structures may be selected from a group consisting of SiO2, SiOC, SiOCN, SiCN, carbon content oxide, nitrogen content oxide, or combination. In some examples, the dielectric fin structures may be selected from a nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or combination.

The method further includes a process 806 for forming a gate structure (e.g., 108) over the first dielectric fin structure, the semiconductor fin structure, and the second dielectric fin structure. Forming the gate structure may involve a photolithographic patterning process to form elongated conductive structures that extend perpendicular to the fin structures. The gate structures for a circuit may originally be formed as long lines, which then need to be cut into several smaller gate structures.

The method 800 further includes a process 808 for removing a portion of the gate structure over the second dielectric fin structure to form an opening to expose a top surface of the second dielectric fin structure. This may be done using a patterning process. Specifically, a photoresist may be deposited onto the workpiece. The photoresist may then be exposed to a light source through a photomask. The photoresist may then be developed so that regions corresponding to where gate cut features are to be formed are exposed. An etching process may then be applied to remove the portion of the gate structure. The opening formed thus separates, or cuts, the gate structure.

The method 800 further includes a process 810 for etching back a top surface of the second dielectric fin structure through the opening such that the top surface of the second dielectric fin structure within the opening is lower than a top surface of the first dielectric fin structure. In other words, the etching process to remove a portion of the gate structure may continue until a portion of the underlying dielectric fin structure is removed.

The method 800 further includes a process 812 for filling the opening with a dielectric material to form a gate-cut feature. This may be done using a deposition process such as Chemical Vapor Deposition (CVD), Atomic Layer Deposition (ALD), Plasma Vapor Deposition (PVD), or other suitable deposition techniques. In some examples, a CMP process may be applied afterwards to planarize the surface of the workpiece.

By using principles described herein, semiconductor device fabrication can be improved. The dummy dielectric fin structures (e.g., 104) provide for topography uniformity, which benefits the fabrication processes for upper layers (gate, contact, metal interconnect layers). The dielectric fin structures may also help isolate neighboring source/drain regions. This can allow larger dimensions for source/drain regions, which can improve device performance. It can also allow for good performance with single fin transistors, which reduces chip space. The larger source/drain region can also make it easier for contact alignment. The larger area of junction between source/drain and contact also reduces contact resistance.

According to one example, a semiconductor device includes a semiconductor fin structure extending in a first direction on a substrate and a first dielectric fin structure extending parallel to the fin structure, the first dielectric fin structure being underneath a gate structure extending in a second direction that is perpendicular to the first direction. The device further includes a second dielectric fin structure extending parallel to the fin structure, the second dielectric feature being positioned beneath a gate cut feature. A top surface of the first dielectric fin structure is higher than a top surface of the second dielectric fin structure.

According to one example, a semiconductor device includes a first dielectric fin structure disposed on a substrate and extending in a first direction, a second dielectric fin structure extending parallel to the first dielectric fin structure, and a semiconductor fin structure extending in the first direction and being positioned between the first dielectric fin structure and the second dielectric fin structure. A top surface of the first dielectric fin structure is higher than a top surface of the second dielectric fin structure.

According to one example, a method includes forming a first dielectric fin structure and a second dielectric fin structure in parallel on a substrate, forming at least one semiconductor fin structure positioned between the first dielectric fin structure and the second dielectric fin structure, forming a gate structure over the first dielectric fin structure, the semiconductor fin structure, and the second dielectric fin structure, removing a portion of the gate structure over the second dielectric fin structure to form an opening to expose a top surface of the second dielectric fin structure, etching back a top surface of the second dielectric fin structure through the opening such that the top surface of the second dielectric fin structure within the opening is lower than a top surface of the first dielectric fin structure, and filling the opening with a dielectric material to form a gate-cut feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a channel region and an epitaxial source/drain region arranged along a first direction and disposed on a substrate;
   a first dielectric fin structure extending longitudinally along the first direction, the first dielectric fin structure being disposed below a gate structure extending longitudinally along a second direction that is perpendicular to the first direction; and
   a second dielectric fin structure extending longitudinally along the first direction, the second dielectric fin structure being disposed below a gate cut feature,
   wherein the gate cut feature contacts an end of the gate structure,
   wherein the channel region is disposed below the gate structure and the epitaxial source/drain region is disposed adjacent to the gate structure, wherein in a first cross-sectional view including the gate structure and the gate cut feature, the first dielectric fin structure includes a first top surface interfacing the gate structure, the second dielectric fin structure includes a second top surface and a sidewall interfacing the gate cut feature, wherein the first top surface is higher than the second top surface, wherein in a second cross-sectional view including the source/drain region, the first dielectric fin structure includes a third top surface and the second dielectric fin structure includes a fourth top surface, and wherein the third top surface and the fourth top surface are at a same level lower than the second top surface.

2. The semiconductor device of claim 1, wherein the first top surface of the first dielectric fin structure is higher than the second top surface of the second dielectric fin structure by a range of about 5-30 nanometers.

3. The semiconductor device of claim 1, wherein a top surface of the channel region is higher than the first top surface of the first dielectric fin structure by a range of about 3-20 nanometers.

4. The semiconductor device of claim 1, wherein the gate cut feature is narrower than the second dielectric fin structure.

5. The semiconductor device of claim 1, wherein the channel region is a first channel region, the semiconductor device further comprising a second channel region positioned between the first dielectric fin structure and the second dielectric fin structure and spaced apart from the first channel along the second direction.

6. The semiconductor device of claim 1, wherein the channel region comprises gate-all-around nanostructures surrounded by the gate structure.

7. The semiconductor device of claim 1, wherein the second dielectric fin structure is wider than the first dielectric fin structure.

8. The semiconductor device of claim 1, wherein the second dielectric fin structure comprises at least two different types of dielectric material.

9. A semiconductor device comprising:
a first dielectric fin structure disposed on a substrate and extending in a first direction;
a second dielectric fin structure extending parallel to the first dielectric fin structure;
a channel region and an epitaxial source/drain region arranged along the first direction and being positioned between the first dielectric fin structure and the second dielectric fin structure;
a metal gate structure disposed above the first dielectric fin structure and the channel region; and
a gate cut feature disposed above the second dielectric fin structure and on an end of the metal gate structure,
wherein a first top surface of the first dielectric fin structure interfacing the metal gate structure is higher than a second top surface of the second dielectric fin structure interfacing the gate cut feature,
wherein the second dielectric fin includes a third top surface interfacing the metal gate structure,
wherein the third top surface is higher than the second top surface.

10. The semiconductor device of claim 9, wherein the first dielectric fin structure has a width within a range of about 5-40 nanometers.

11. The semiconductor device of claim 9, wherein the second dielectric fin structure has a width within a range of about 40-500 nanometers.

12. The semiconductor device of claim 9, wherein said first dielectric fin structure and said second dielectric fin structure comprise at least one of: $SiO_2$, SiOC, SiOCN, or SiCN,
wherein the second dielectric fin includes a first layer and a second layer, the second layer having a uniform composition,
wherein the first layer is enclosed by the second layer, and
wherein a portion of the gate cut feature is embedded in the second layer.

13. The semiconductor device of claim 9, wherein said first dielectric fin structure and said second dielectric fin structure comprise at least one of: $HfO_2$, $Ta_2O_5$, $TiO_2$, $ZrO_2$, $Al_2O_3$, $Y_2O_3$.

14. A method comprising:
forming a first dielectric fin structure and a second dielectric fin structure in parallel on a substrate;
forming at least one semiconductor fin structure positioned between the first dielectric fin structure and the second dielectric fin structure;
forming a gate structure over the first dielectric fin structure, the semiconductor fin structure, and the second dielectric fin structure;
performing a first etching process to remove a portion of the gate structure over the second dielectric fin structure but not over the first dielectric fin structure to form an opening to expose a top surface of a first portion of the second dielectric fin structure, while a top surface of a second portion of the second dielectric fin structure remains not exposed;
performing a second etching process to etch back the first portion of the second dielectric fin structure to extend the opening such that a recessed top surface of the first portion of the second dielectric fin structure within the opening is lower than a top surface of the first dielectric fin structure and lower than the top surface of the second portion of the second dielectric fin structure; and
filling the opening with a dielectric material to form a gate-cut feature.

15. The method of claim 14, wherein a top surface of the semiconductor fin structure is higher than the top surface of the first dielectric fin structure.

16. The method of claim 14, wherein the first dielectric fin structure and the second dielectric fin structure comprise a low-k dielectric having a dielectric constant less than 7, and
wherein a portion of the gate-cut feature is embedded in the second dielectric fin structure.

17. The semiconductor device of claim 1, wherein the second dielectric fin structure includes a fifth top surface directly under the gate structure, wherein the fifth top surface is higher than the second top surface by a distance within a range of about 5-30 nanometers.

18. The semiconductor device of claim 1, further comprising an interlayer dielectric (ILD) layer adjacent to the gate structure and the gate cut feature and disposed on the fourth top surface of the second dielectric fin structure.

19. The semiconductor device of claim 9, wherein in a cross-sectional view of the metal gate structure, the gate cut feature, and the first dielectric fin structure, an entirety of the top surface of the first dielectric fin structure is in contact with the metal gate structure.

20. The semiconductor device of claim 1, wherein the substrate includes a first well and a second well of different types,
wherein the first dielectric fin is disposed over the first well, and wherein the channel region, the epitaxial source/drain region, and the second dielectric fin are disposed over the second well.

\* \* \* \* \*